(12) United States Patent
Shih et al.

(10) Patent No.: US 7,180,572 B2
(45) Date of Patent: Feb. 20, 2007

(54) IMMERSION OPTICAL PROJECTION SYSTEM

(75) Inventors: Jen-Chieh Shih, Yongkang (TW);
Burn-Jeng Lin, Hsin-Chu (TW);
Tsai-Sheng Gau, Hsin-Chu (TW);
Ru-Gun Liu, Hsin-Chu (TW);
Chun-Kuang Chen, Taoyuan (TW);
Chin-Hsiang Lin, Hsin-Chu (TW);
Horng-Huei Tseng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 60 days.

(21) Appl. No.: 11/009,505

(22) Filed: Dec. 10, 2004

(65) Prior Publication Data

US 2005/0286030 A1 Dec. 29, 2005

Related U.S. Application Data

(60) Provisional application No. 60/582,203, filed on Jun. 23, 2004.

(51) Int. Cl.
G03B 27/42 (2006.01)
(52) U.S. Cl. .............................. 355/30; 355/53; 355/76; 355/71; 378/34; 378/35
(58) Field of Classification Search ................ None
See application file for complete search history.

(56) References Cited

U.S. PATENT DOCUMENTS 6,954,256 B2 * 10/2005 Flagello et al. ............... 355/53

2005/0068499 A1 * 3/2005 Dodoc et al. ................. 353/10
2005/0094119 A1 * 5/2005 Loopstra et al. .............. 355/67
2005/0237501 A1 * 10/2005 Furukawa et al. ............ 355/30
2006/0061747 A1 * 3/2006 Ishii ............................ 355/53
2006/0164616 A1 * 7/2006 Okada .......................... 355/53

OTHER PUBLICATIONS

Mulkens, J., et al., "Study on Immersion Lithography," Immersion Lithography Workshop ISMT, Jul. 11, 2003, Slides 1-24.
Owa, S., et al., "Immersion Lithography Exposure Tool Update," Immersion Lithography Workshop, Jul. 11, 2003, Slides 1-30.
Lin, Burn J., "Immersion lithography and its impact on semiconductor manufacturing," 2004 Society of Photo-Optical Instrumentation Engineers, Jul. 2004, pp. 337-395.

* cited by examiner

Primary Examiner—D. Rutledge
(74) Attorney, Agent, or Firm—Slater & Matsil, L.L.P.

(57) ABSTRACT

An immersion optical projection system for photolithography is provided. A transparent plate is located between a last lens element and the wafer during a usage of the system. The transparent plate has a lens-side surface and a wafer-side surface. The system is adapted to have a layer of lens-side fluid located between the last lens element and the lens-side surface of the transparent plate, e.g., when the last lens element is operably located over the wafer during a photolithography process. The system is also adapted to have a layer of wafer-side fluid located between the wafer-side surface of the transparent plate and the wafer, during a usage of the system. The wafer-side fluid may or may not be fluidly connected to the lens-side fluid. The wafer-side fluid may or may not differ from the lens-side fluid.

36 Claims, 5 Drawing Sheets

IMMERSION OPTICAL PROJECTION SYSTEM

This application claims the benefit of U.S. Provisional Application No. 60/582,203, filed on Jun. 23, 2004, entitled Anti-Contamination Device Of Lens For Immersion Lithography, which application is hereby incorporated herein by reference.

TECHNICAL FIELD

The present invention generally relates to immersion optical projection systems for use in photolithography processes in the fabrication of semiconductor devices.

BACKGROUND

Photolithography processes are used in semiconductor manufacturing to transfer a pattern from a photomask to the surface of a wafer or substrate. As part of a typical photolithography process, photoresist layer (usually a polymeric material that changes properties when exposed to light) is applied over an intermediate structure. The desired pattern is projected onto the photoresist through the photomask and though a series of lenses in an optical projection system. The lenses reduce the scale of the projected image. The reduction provided by the lens can vary depending on the design rules. A typical reduction is on the order of 4×–5× magnification, for example. When the mask pattern is projected onto the photoresist layer on the wafer, the exposed regions become more or less acidic. After the photoresist is developed, portions of the photoresist are removed to provide a patterned photoresist layer.

The ability to project a clear and precise pattern of the smallest features onto the wafer is often limited by the wavelength of the light used. Current photolithography systems use deep ultraviolet (DUV) light with wavelengths of about 248 nm and about 193 nm, which typically can provide feature sizes on the order of about 130–90 nm, for example. To extend 193 nm photolithography to feature sizes of 45 nm and smaller, liquid immersion photolithography techniques are being used. This enables the use of optics with numerical apertures exceeding 1.0.

FIG. 1 is a simplified schematic of an immersion optical projection system 10 of the prior art being used in a photolithography process. The system 10 shown in FIG. 1 is sometimes referred to as a shower configuration. Often in such systems, the fluid 12 is continually circulated to eliminate thermally-induced distortions. In the system 10 shown in FIG. 1, the circulated fluid 12 is located between a last lens element 22 and the wafer 24 during a photolithography process. In the immersion head 26 for the system 10 of FIG. 1, a fluid inlet 14 routes the fluid flow to the space between the last lens element 22 and the wafer 24, and a fluid outlet 16 receives the fluid flow. A typical wafer chuck 28 is shown in FIG. 1, which in this case retains the wafer 24 using a vacuum force provided by vacuum channels 30 and a vacuum line 32. The fluid 12 is confined by capillary force, as the fluid thickness is typically on the order of about 1–2 mm. Further confinement may be achieved by using vacuum channels and/or air bearing(s) (not shown) at the outer region of the immersion head 26. The fluid used in an immersion optical projection system is typically ultra-pure, deionized water, which provides a refractive index above that of the usual air gap between the lens and the wafer surface. Additives or dopants may be added to the water to give a higher refractive index.

In a fluid immersion system, it is usually preferred to use a fluid with a high refractive index and low absorption. It is undesirable for the fluid to absorb particles from the wafer. However, while using the system 10 of FIG. 1, particles from the photoresist layer still tend to get into the circulated fluid stream 12. Such particles can be carried to the surface of the last lens element 22. This is undesirable because it can contaminate the lens and eventually require a lens replacement, which is expensive. Hence, there is a need for an immersion optical projection system for use in photolithography that will not, or is less likely to, contaminate the lens while still providing the advantages and desirable functions of a fluid immersion system.

SUMMARY OF THE INVENTION

The problems and needs outlined above may be addressed by embodiments of the present invention. In accordance with one aspect of the present invention, an immersion optical projection system for photolithography is provided, which includes a last lens element, a wafer chuck, and a transparent plate. The wafer chuck is adapted to retain a wafer. The transparent plate is located between the last lens element and the wafer during a usage of the system. The transparent plate has a lens-side surface and a wafer-side surface. The system is adapted to have a layer of lens-side fluid located between the last lens element and the lens-side surface of the transparent plate. The system is also adapted to have a layer of wafer-side fluid located between the wafer-side surface of the transparent plate and the wafer. In an embodiment, the wafer-side fluid may or may not differ from the lens-side fluid. In an embodiment, the wafer-side fluid may or may not be fluidly connected to the lens-side fluid. In an embodiment, a wafer-side fluid flow rate of the wafer-side fluid layer may or may not differ from a lens-side fluid flow rate (which may be static or dynamic) of the lens-side fluid layer.

In accordance with another aspect of the present invention, an immersion optical projection system for photolithography is provided, which includes a last lens element and a protective transparent plate. The protective transparent plate is attached to the last lens element. A static layer of lens-side fluid is located between the last lens element and the protective transparent plate.

In accordance with a yet another aspect of the present invention, an immersion optical projection system for photolithography is provided, which includes a wafer chuck and a protective transparent plate. The wafer chuck is adapted to retain a wafer. The protective transparent plate is attached to the wafer chuck. The wafer chuck is adapted to have a dynamic layer of wafer-side fluid located between the protective transparent plate and the wafer during a photolithography process.

In accordance with still another aspect of the present invention, an immersion optical projection system for photolithography is provided, which includes a last lens element, a wafer chuck, and a protective transparent plate. The last lens element has a lens surface characteristic providing a lens wetting property. The wafer chuck is adapted to retain a wafer. The wafer has a wafer surface characteristic providing a wafer wetting property. The protective transparent plate is located between the last lens element and the wafer during a photolithography process. The protective transparent plate has a lens-side surface and a wafer-side surface. The lens-side surface of the protective transparent plate has a lens-side surface characteristic. The wafer-side surface of the protective transparent plate has a wafer-side surface characteristic. The lens-side surface characteristic differs from the wafer-side surface characteristic.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
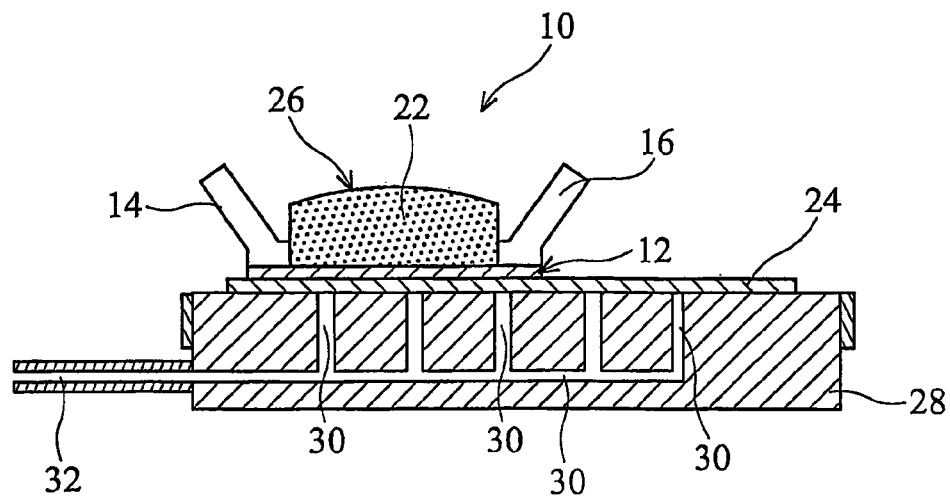
FIG. 1 is a simplified schematic of an immersion optical projection system of the prior art being used in a photolithography process.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 2:
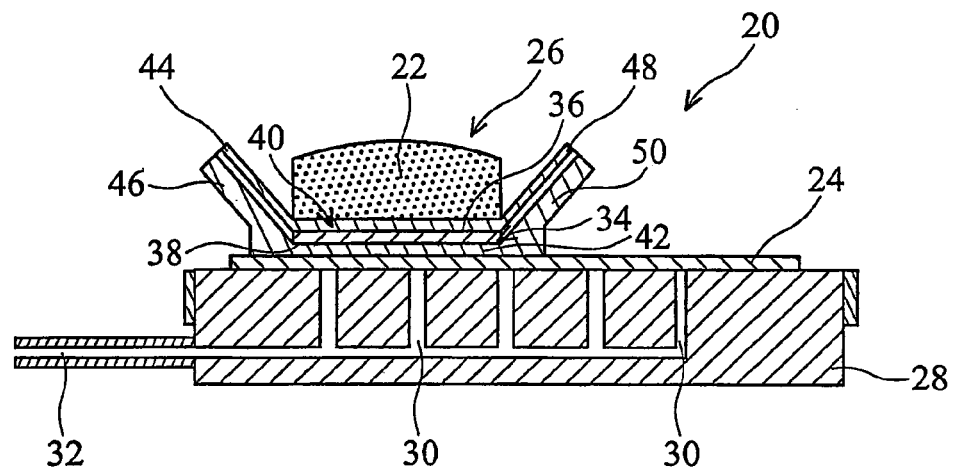
FIG. 2 is a simplified schematic of an immersion optical projection system of a first embodiment of the present invention being used in a photolithography process.
Figure 3:
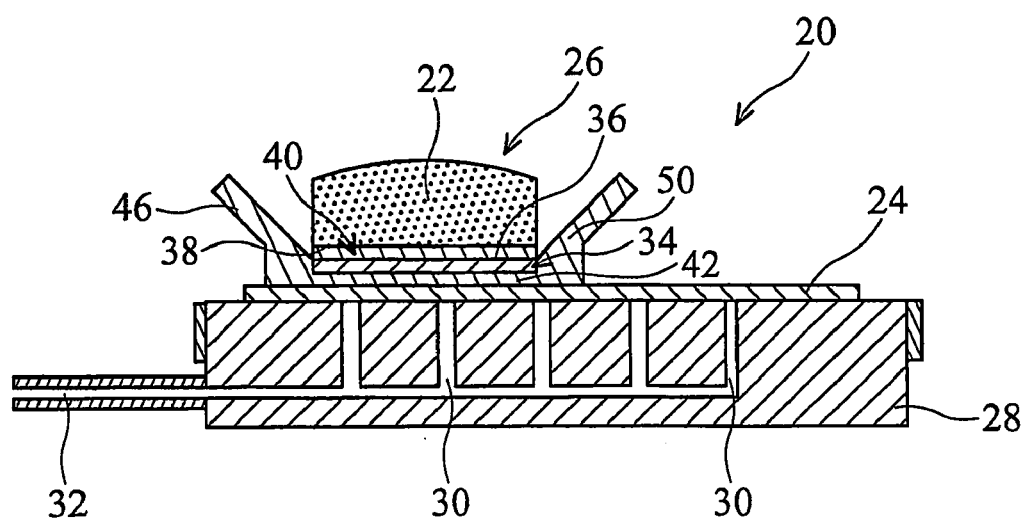
FIG. 3 is a simplified schematic of an immersion optical projection system of a second embodiment of the present invention being used in a photolithography process.

Generally, an embodiment of the present invention provides an immersion optical projection system for use in photolithography processes during the fabrication of semiconductor devices. FIG. 2 shows a first illustrative embodiment of the present invention. FIG. 3 shows a second illustrative embodiment of the present invention. And, FIGS. 4–6C show a third illustrative embodiment of the present invention. Various aspects, features, and advantages of these three illustrative embodiments will be described in the context of performing a photolithography process for fabricating semiconductor devices. Note that various features from any of these embodiments described herein may be mixed or combined in any viable combinations for other embodiments of the present invention. Also note that criteria and characteristics described or discussed for one illustrative embodiment may or may not also apply to another embodiment of the present invention, but in most cases this will be apparent to one of ordinary skill in the art with the benefit of this disclosure.

FIG. 2 is a simplified schematic of an immersion optical projection system 20 of a first embodiment of the present invention being used in a photolithography process. In the system 20 of FIG. 2, the immersion head 26 includes a last lens element 22 and a protective transparent plate 34. In FIG. 2, the immersion head 26 is located over a wafer 24 during a photolithography process. During a photolithography process, the protective transparent plate 34 is located between the last lens element 22 and the wafer 24. The protective transparent plate 34 has a lens-side surface 36 and a wafer-side surface 38. A layer of lens-side fluid 40 is located between the last lens element 22 and the lens-side surface 36 of the protective transparent plate 34 during a photolithography process, as shown in FIG. 2. This lens-side fluid layer 40 has a lens-side fluid flow rate, which may be zero or greater than zero. Additionally in the first embodiment, a layer of wafer-side fluid 42 is located between the wafer-side surface 38 of the protective transparent plate 34 and the wafer 24. This wafer-side fluid layer 42 has a wafer-side fluid flow rate, which may or may not differ from the lens-side fluid flow rate and which may be zero or greater than zero.

In the first embodiment, fluid inlets 44, 46 and fluid outlets 48, 50 are located adjacent to the last lens element 22. The lens-side fluid inlet 44 is positioned to route the lens-side fluid flow between the last lens element 22 and the protective transparent plate 34 to provide the lens-side fluid layer 40. The lens-side fluid outlet 48 is positioned to receive at least part of the lens-side fluid flow 40. The wafer-side fluid inlet 46 is positioned to route the wafer-side fluid flow between the protective transparent plate 34 and the wafer 24 to provide the wafer-side fluid layer 42. The wafer-side fluid outlet 50 is positioned to receive at least part of the wafer-side fluid flow 42. In the first embodiment, it is preferred that the lens-side fluid 40 is not fluidly connected to the wafer-side fluid 42 to prevent contamination particles in the wafer-side fluid 42 (e.g., from the photoresist material on the wafer 24) from getting to the last lens element 22. If or when the protective transparent plate 34 gets contaminated with particles, it can be replaced, rather than replacing the last lens element 22. This is advantageous because the protective transparent plate 34 will most likely be much less expensive to replace than the last lens element 22. It is also likely to be much easier to replace the protective transparent plate 34 than the last lens element 22. In a preferred embodiment, the protective transparent plate 34 is adapted to be easily removable and replaceable. But in some embodiments, the plate 34 may be permanently attached to another part, which may or may not be easily removed.

In other embodiments, the lens-side fluid 40 may be fluidly connected to the wafer-side fluid 42 at some place in the system for some embodiments. In such cases, it is preferred that the wafer-side fluid 42 is filtered before joining the lens-side fluid stream 40. However, there are many reasons to use two different fluids 40, 42. For example, the surface characteristics (e.g., wetting angle) of the photoresist surface on the wafer 24 and the lens surface may be different. Different additive(s) in the fluid may be used in each layer 40, 42 to match the wetting properties of the lens and wafer surfaces, respectively. Hence, the lens-side fluid 40 may have a different wetting property than the wafer-side fluid 42. The lens-side fluid 40 may include one or more additives to make the lens-side fluid 40 have a lens-side fluid wetting property that is better matched to a wetting property of the last lens element 22 than to that of the wafer 24 (e.g., photoresist surface). Likewise, the wafer-side fluid 42 may include one or more additives to make the wafer-side fluid 42 have a wafer-side fluid wetting property that is better matched to a wetting property of the wafer 24 than to that of the last lens element 22.

Another reason why it may be desirable to use two different fluids 40, 42 in the system 20 is that it may be desirable to have a different refractive index for each fluid. For example, the lens-side fluid 40 may have a refractive index that is closer to the refractive index of the last lens element 22 than to that of the wafer 24 and/or the plate 34. Whereas, it may be preferred to have a different refractive index for the wafer-side fluid 42. Furthermore, if the lens-side fluid 40 is not fluidly connected with the wafer-side fluid 42, the lens-side fluid 40 does not necessarily need to be a low absorption fluid, as compared to the wafer-side fluid 42, because it will not be in contact with the wafer 24.

For a fluid immersion system 20 of the present invention that incorporates the protective transparent plate 34, preferably all of spaces between the last lens element 22, the protective plate 34, and the wafer 24 (at least along the light pattern projection path) are filled with fluids (i.e., a high index media). In a preferred embodiment of the present invention, the plate 34 is immersed in fluids 40, 42 covering both sides. If any space along the projection path has an air gap or bubble, higher spatial frequencies from the mask pattern through the lens may not be coupled to the photoresist properly. The fluids 40, 42 on each side of the plate 34 also reduce the dependency of extremely high optical quality for the plate 34. Because the plate 34 is also an optical element along the projection path of an extremely low aberration system, the surface flatness, smoothness, parallelism, placement, and orientation of the plate 34 would otherwise need to be precise to a fraction of the light's wavelength. But in an embodiment of the present invention, if the refractive index of the lens-side fluid 40 and the last lens element 22 are perfectly matched, there is no need to maintain the above-mentioned optical quality. Even though, in an actual application, the refractive index of the lens-side fluid 40 and the last lens element 22 will not likely be perfectly matched, there is still a substantial relaxation of the above-mentioned optical qualities because there can be closer match than if air filled the spaces. For example, the plate 34 may be made of quartz and the lens-side fluid 40 may be water for a 193 nm wavelength setup. In such case, the index difference may be about 1.55–1.44=0.11. In comparison, the index difference for a dry system (air gap) would be 1.55–1.00=0.55. Hence, there is about a 5× relaxation.

The material of the protective transparent plate 34 is preferably transparent to actinic light by having a transmission of about 80% or higher. Hence, the plate is preferably transparent (e.g., >80% transmission) for the light wavelengths being used in the system 20. The system 20 of an embodiment may be adapted for use with light wavelengths of about 436 nm, about 365 nm, about 248 nm, about 193 nm, or less, for example. The protective transparent plate 34 may be made from any of a wide variety of suitable materials, including (but not necessarily limited to): quartz, fused silica, $CaF_2$, $LiF_2$, $MgF_2$, and combinations thereof, for example. The refractive index of the plate 34 is preferred to be equal to or higher than that of the fluids 40, 42. The fluids 40, 42 preferably have a refractive index of about 1.3 or higher, for example. Water (e.g., ultra-pure, deionized water) is a preferred fluid for use in an embodiment because it has a refractive index greater than air (i.e., greater than 1). Dopant(s) and/or additive(s) may be added to water to tailor the fluids 40, 42 to the desired properties (e.g., wetting property) in an embodiment. But in other embodiments, these factors and criteria may vary.

The plate 34 may be substantially flat, partially curved, curved, or combinations thereof, for example. Another advantage of an embodiment of the present invention is that the surface on the lens-side 36 of the plate 34 may differ from the surface of the wafer-side 38 of the plate 34. The last lens element 22 has a lens surface characteristic providing a lens wetting property. The wafer 24 has a wafer surface characteristic providing a wafer wetting property. In an embodiment, the lens-side surface 36 of the plate 34 may have a lens-side surface characteristic that differs from a wafer-side surface characteristic for the wafer-side surface 38 of the plate 34. The lens-side surface 36 of the plate 34 may have a lens-side surface characteristic providing a lens-side plate wetting property that is more closely matched to the lens wetting property provided by the lens surface characteristic than the wafer-side surface characteristic. And/or vice versa, the wafer-side surface characteristic of the plate 34 may be more closely matched to the wafer wetting property than the lens-side surface characteristic. Thus, the surfaces 36, 38 of the protective transparent plate 34 may be modified or tailored to match (or more closely match than if not modified) the wetting property of the photoresist and the lens surfaces separately.

In an embodiment of the present invention, the lens-side fluid layer 40 between the last lens element 22 and the plate 34 may be static, dynamic, or varying. Likewise, the wafer-side fluid layer 42 between the plate 34 and the wafer 24 may be static, dynamic, or varying. In the first embodiment (described above), the lens-side fluid 40 and the wafer-side fluid 42 are preferably dynamic during a photolithography process, although either may vary between being static and dynamic.

FIG. 3 is a simplified schematic of an immersion optical projection system 20 of a second embodiment of the present invention being used in a photolithography process. In the second embodiment, the lens-side fluid 40 is static, and the wafer-side fluid 42 is dynamic. The lens-side fluid 40 may or may not be hermitically sealed between the plate 34 and the last lens element 22. The protective transparent plate 34 is attached to the last lens element 22. In other words, the plate 34 is stationary relative to the last lens element 22 during normal use of the system 20. Although the plate 34 is "attached" to the last lens element 22, it may or may not be directly attached to the last lens element 22, as they may be both attached to the immersion head 26 (e.g., plate 34 attached to last lens element 22 via some other portion of the immersion head assembly 26).

In an embodiment of the present invention, the plate 34 may be stationary relative to the immersion head 26, the last lens element 22, the wafer 24, the wafer chuck 28, or any combination thereof, when the last lens element 22 moves relative to the wafer 24 during use of the system 20. For example, in the first and second embodiments described above (see e.g., FIGS. 2 and 3), the plate 34 remains stationary relative to the immersion head 26 and the last lens element 22 when the last lens element 22 moves relative to the wafer 24.

Figure 4:
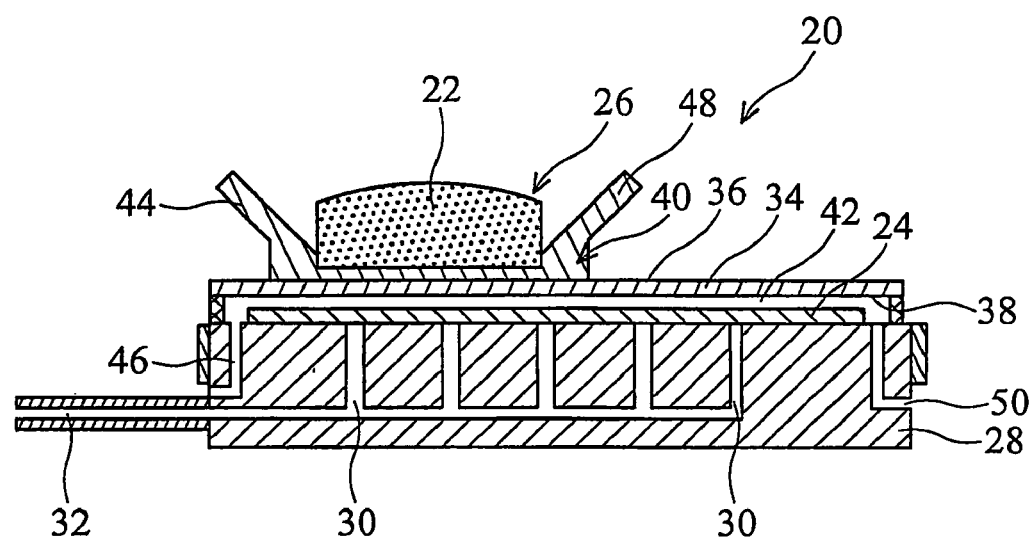
FIG. 4 is a simplified schematic of an immersion optical projection system of a third embodiment of the present invention being used in a photolithography process.

FIG. 4 is a simplified schematic of an immersion optical projection system 20 of a third embodiment of the present invention being used in a photolithography process. In the third embodiment, the plate 34 remains stationary relative to the wafer 24 and the wafer chuck 28 when the last lens element 22 moves relative to the wafer 24. The plate 34 is removably attached to the wafer chuck 28 to allow for the placement and removal of the wafer 24. A wafer-side fluid inlet 46 and outlet 50 are in the wafer chuck 28 to route the wafer-side fluid flow 42 between the plate 34 and the wafer 24. A lens-side fluid inlet 44 and outlet 48 are located adjacent to the last lens element 22 in the immersion head 26 to provide the lens-side fluid layer 40.

Figure 5:
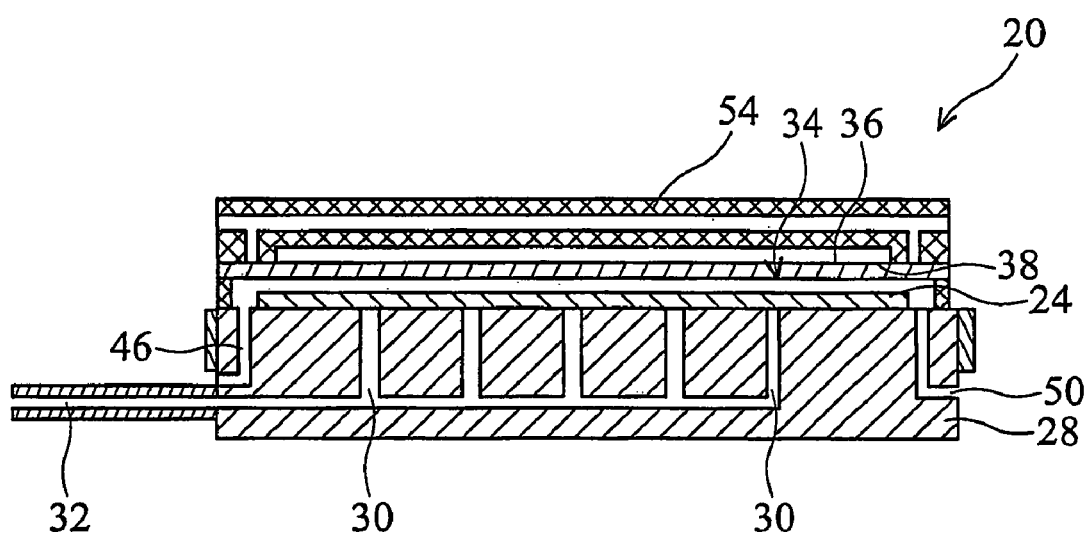
FIG. 5 is a simplified schematic of the system of the third embodiment in a configuration for placing or removing the protective transparent plate.

FIG. 5 shows a plate carrier 54 positioned over the protective transparent plate 34. The plate 34 may be laid on and retrieved from the wafer chuck 28 using the carrier 54, as shown in FIG. 5. In a preferred embodiment, the plate 34 is picked up and retained by the carrier 54 using vacuum pressure, for example. Also, the plate 34 may be held to the wafer chuck 28 during a photolithography process using vacuum pressure.

Figure 6A:
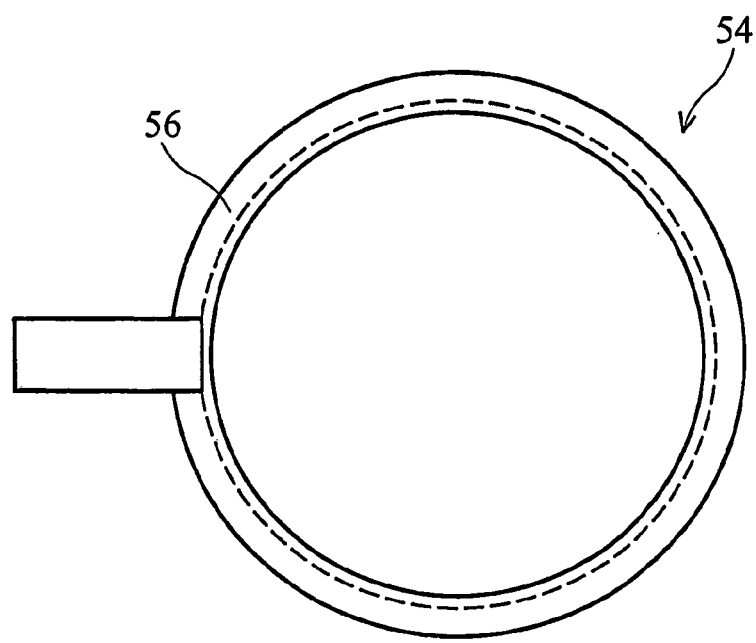
FIGS. 6A–6C are top views showing several variations for a protection plate carrier.
Figure 6B:
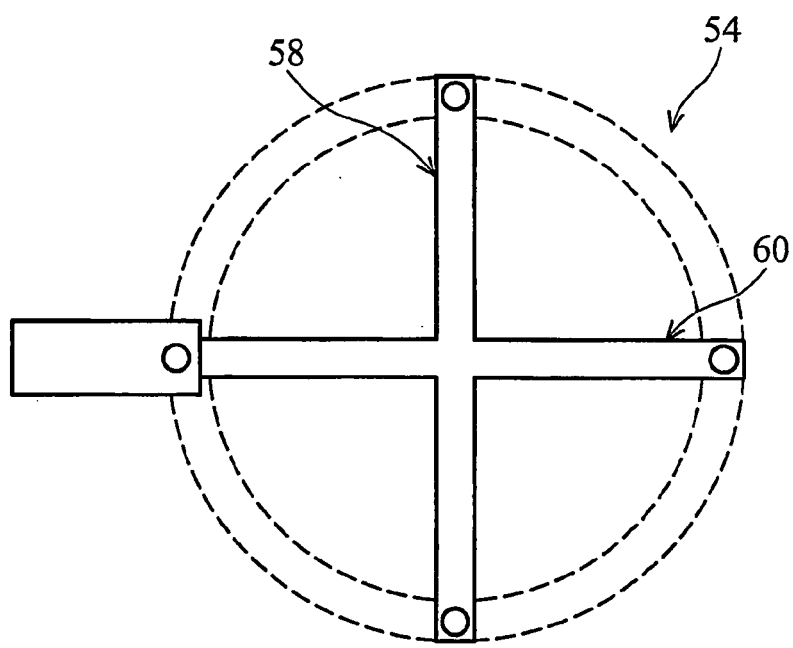
Figure 6C:
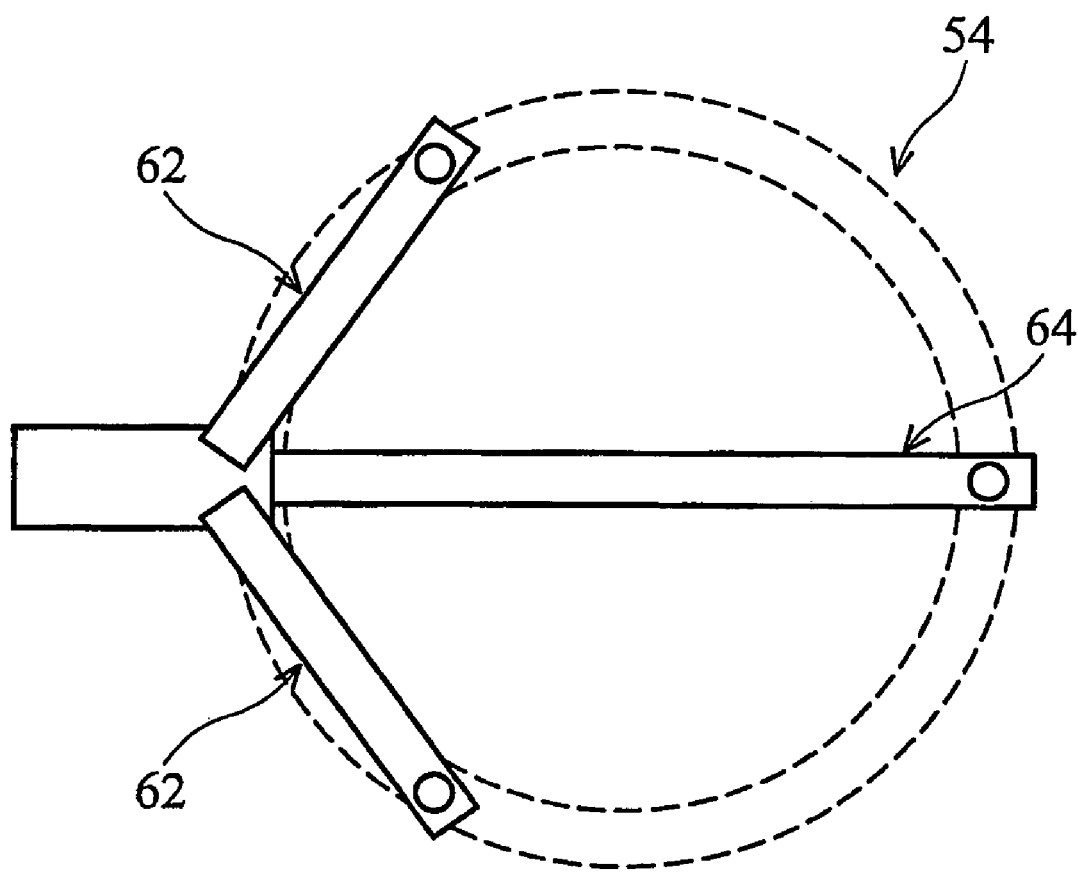

After handling the plate 34, the carrier 54 may be parked at a convenient location within the exposure system 20, for example. In such cases, it may be desirable or required to minimize the parking space required by the carrier 54 during the photolithography processing. To reduce the parking space requirement, the carrier 54 may have any of a number of suitable shapes. FIGS. 6A–6C show some illustrative examples of ways (among many) in which the carrier 54 may be configured. FIGS. 6A–6C show top views of the example carriers 54. In FIG. 6A, the carrier 54 has a ring shape including vacuum grooves and/or distributed vacuum holes about the ring 56, for example. In FIG. 6B, the carrier 54 has a cross shape, as another example shape. The lateral arm 58 of the carrier 54 in FIG. 6B is pivotable coupled to the longitudinal arm 60 so that the lateral arm 58 may be folded toward the longitudinal arm 60 when not in use. FIG. 6C shows yet another example shape. In FIG. 6C, the carrier 54 has a fork shape with two pivotably coupled side arms 62. These side arms 62 are adapted to be folded toward the central arm 64 to provide a more compact folded configuration, which conserves space. With the benefit of this disclosure, one of ordinary skill in the art will likely realize many other configurations for a carrier 54 without departing from the spirit and scope of the present invention.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An immersion optical projection system for photolithography comprising:
   a last lens element;
   a wafer chuck adapted to retain a wafer;
   a transparent plate located between the last lens element and the wafer during a usage of the system, the transparent plate having a lens-side surface and a wafer-side surface;
   the system being adapted to have a layer of lens-side fluid located between the last lens element and the lens-side surface of the transparent plate; and
   the system being adapted to have a layer of wafer-side fluid located between the wafer-side surface of the transparent plate and the wafer, wherein the lens-side fluid differs from the wafer-side fluid, and wherein the lens-side fluid has a different wetting property than the wafer-side fluid.

2. The immersion optical projection system of claim 1, wherein the wafer-side fluid is not fluidly connected to the lens-side fluid.

3. The immersion optical projection system of claim 1, wherein the lens-side fluid comprises an additive included to make the lens-side fluid have a lens-side fluid wetting property that is better matched to a wetting property of the last lens element than to that of the wafer.

4. The immersion optical projection system of claim 1, wherein the wafer-side fluid comprises an additive included to make the wafer-side fluid have a wafer-side fluid wetting property that is better matched to a wetting property of the wafer than to that of the last lens element.

5. The immersion optical projection system of claim 1, wherein the lens-side fluid comprises water.

6. The immersion optical projection system of claim 1, wherein the wafer-side fluid comprises water.

7. The immersion optical projection system of claim 1, wherein the lens-side fluid comprises water and an additive.

8. The immersion optical projection system of claim 1, wherein the wafer-side fluid comprises water and an additive.

9. The immersion optical projection system of claim 1, wherein the transparent plate is attached to the last lens element, and wherein the lens-side fluid layer is static and is located between the last lens element and the transparent plate.

10. The immersion optical projection system of claim 9, wherein the wafer-side fluid layer is dynamic, such that a wafer-side fluid flow rate is greater than a lens-side fluid flow rate.

11. The immersion optical projection system of claim 10, further comprising:
   a fluid inlet located adjacent to the last lens element during a usage of the system, the fluid inlet being positioned to route a fluid flow between the transparent plate and the wafer to provide at least part of the dynamic wafer-side fluid layer; and
   a fluid outlet located adjacent to the last lens element during a usage of the system, the fluid outlet being positioned to receive at least part of the fluid flow from between the transparent plate and the wafer to provide at least part of the dynamic wafer-side fluid layer.

12. The immersion optical projection system of claim 9, wherein the transparent plate is removably attached to the last lens element.

13. The immersion optical projection system of claim 1, wherein the transparent plate is removably attached to the wafer chuck during a usage of the system.

14. An immersion optical projection system for photolithography comprising:
   a last lens element;
   a wafer chuck adapted to retain a wafer;

a transparent plate located between the last lens element and the wafer during a usage of the system, the transparent plate having a lens-side surface and a wafer-side surface;

the system being adapted to have a layer of lens-side fluid located between the last lens element and the lens-side surface of the transparent plate; and the system being adapted to have a layer of wafer-side fluid located between the wafer-side surface of the transparent plate and the wafer, wherein the lens-side fluid layer is dynamic when the last lens element is operably located over the wafer during a usage of the system.

15. The immersion optical projection system of claim 14, further comprising:

a lens-side fluid inlet located adjacent to the last lens element during a usage of the system, the lens-side fluid inlet being positioned to route a lens-side fluid flow between the last lens element and the transparent plate to provide at least part of the lens-side dynamic fluid layer; and a lens-side fluid outlet located adjacent to the last lens element during a usage of the system, the lens-side fluid outlet being positioned to receive at least part of the lens-side fluid flow from between the last lens element and the transparent plate to provide at least part of the lens-side dynamic fluid layer.

16. The immersion optical projection system of claim 15, wherein the wafer-side fluid layer is dynamic, and further comprising:

a wafer-side fluid inlet in the wafer chuck, the wafer-side fluid inlet being positioned to route a wafer-side fluid flow between the transparent plate and the wafer to provide the wafer-side dynamic fluid layer; and a wafer-side fluid outlet in the wafer chuck, the wafer-side fluid outlet being positioned to receive at least part of the wafer-side fluid flow from between the transparent plate and the wafer to provide the wafer-side dynamic fluid layer.

17. An immersion optical projection system for photolithography comprising:

a last lens element;

a wafer chuck adapted to retain a wafer;

a transparent plate located between the last lens element and the wafer during a usage of the system, the transparent plate having a lens-side surface and a wafer-side surface;

the system being adapted to have a layer of lens-side fluid located between the last lens element and the lens-side surface of the transparent plate; and the system being adapted to have a layer of wafer-side fluid located between the wafer-side surface of the transparent plate and the wafer, wherein a wafer-side fluid flow rate of the wafer-side fluid layer differs from a lens-side fluid flow rate of the lens-side fluid layer.

18. An immersion optical projection system for photolithography comprising:

a last lens element;

a wafer chuck adapted to retain a wafer;

a transparent plate located between the last lens element and the wafer during a usage of the system, the transparent plate having a lens-side surface and a wafer-side surface;

the system being adapted to have a layer of lens-side fluid located between the last lens element and the lens-side surface of the transparent plate; and the system being adapted to have a layer of wafer-side fluid located between the wafer-side surface of the transparent plate and the wafer, wherein the last lens element has a lens surface characteristic providing a lens wetting property, the wafer has a wafer surface characteristic providing a wafer wetting property, the lens-side surface of the transparent plate has a lens-side surface characteristic, the wafer-side surface of the transparent plate has a wafer-side surface characteristic, and the lens-side surface characteristic differs from the wafer-side surface characteristic.

19. The immersion optical projection system of claim 18, wherein the lens-side surface characteristic of the lens-side of the transparent plate provides a lens-side plate wetting property that is more closely matched to the lens wetting property provided by the lens surface characteristic than the wafer-side surface characteristic of the wafer-side of the transparent plate.

20. The immersion optical projection system of claim 18, wherein the wafer-side surface characteristic of the wafer-side of the transparent plate provides a wafer-side plate wetting property that is more closely matched to the wafer wetting property provided by the wafer surface characteristic than the lens-side surface characteristic of the lens-side of the transparent plate.

21. The immersion optical projection system of claim 18, wherein the transparent plate comprises quartz.

22. The immersion optical projection system of claim 18, wherein the transparent plate comprises $CaF_2$.

23. The immersion optical projection system of claim 18, further comprising a carrier for moving the transparent plate, wherein the carrier has at least one pivotable coupled arm.

24. The immersion optical projection system of claim 18, wherein the system is adapted for use with wavelengths of 193 nm or less.

25. The immersion optical projection system of claim 18, wherein the system is adapted for use with wavelengths of about 248 nm.

26. The immersion optical projection system of claim 18, wherein at least part of the transparent plate is substantially flat.

27. An immersion optical projection system for photolithography comprising:

a last lens element;

a wafer chuck adapted to retain a wafer;

a transparent plate located between the last lens element and the wafer during a usage of the system, the transparent plate having a lens-side surface and a wafer-side surface;

the system being adapted to have a layer of lens-side fluid located between the last lens element and the lens-side surface of the transparent plate; and the system being adapted to have a layer of wafer-side fluid located between the wafer-side surface of the transparent plate and the wafer, wherein the lens-side fluid differs from the wafer-side fluid, and wherein at least part of the transparent plate is curved.

28. An immersion optical projection system for photolithography comprising:

a last lens element;

a transparent plate attached to the last lens element; and a static layer of lens-side fluid located between the last lens element and the transparent plate.

29. The immersion optical projection system of claim 28, further comprising:

a wafer chuck adapted to retain a wafer; and the system being adapted to have a dynamic layer of wafer-side fluid located between the transparent plate and the wafer when the last lens element is operably located over the wafer during a photolithography process.

30. The immersion optical projection system of claim 29, further comprising:

a fluid inlet located adjacent to the last lens element during a usage of the system, the fluid inlet being positioned to route a fluid flow between the transparent plate and the wafer to provide at least part of the dynamic wafer-side fluid layer; and a fluid outlet located adjacent to the last lens element during a usage of the system, the fluid outlet being positioned to receive at least part of the fluid flow from between the transparent plate and the wafer to provide at least part of the dynamic wafer-side fluid layer.

31. A method fabricating an integrated circuit chip, the method comprising:

placing a last lens element over a wafer, wherein a transparent plate is located between the last lens element and the wafer, wherein the plate has a lens-side surface and a wafer-side surface;

performing a photolithography process on the wafer;

providing a lens-side fluid between the last lens element and the lens-side surface of the protective plate during the performing of the photolithography process; and providing a wafer-side fluid between the wafer-side surface of the protective plate and the wafer during the performing of the photolithography process, wherein the lens-side fluid has a different wetting property than the wafer-side fluid.

32. The method of claim 31, wherein the lens-side fluid is static and the wafer-side fluid is dynamic during the performing of the photolithography process.

33. The method of claim 31, wherein the lens-side fluid is dynamic and the wafer-side fluid is dynamic during the performing of the photolithography process.

34. The method of claim 31, wherein the lens-side fluid has a lens-side fluid flow rate, wherein the wafer-side fluid has wafer-side fluid flow rate, and wherein the lens-side fluid flow rate differs from the wafer-side fluid flow rate during the performing of the photolithography process.

35. The method of claim 31, wherein the lens-side fluid differs from the wafer-side fluid.

36. The method of claim 31, wherein the lens-side fluid is not fluidly connected to the wafer-side fluid.

* * * * *